United States Patent
Kuwana et al.

(10) Patent No.: US 10,522,373 B2
(45) Date of Patent: Dec. 31, 2019

(54) GRINDING APPARATUS

(71) Applicant: DISCO CORPORATION, Tokyo (JP)

(72) Inventors: Kazutaka Kuwana, Tokyo (JP); Tetsuo Kubo, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 179 days.

(21) Appl. No.: 15/873,216

(22) Filed: Jan. 17, 2018

(65) Prior Publication Data
US 2018/0204746 A1    Jul. 19, 2018

(30) Foreign Application Priority Data

Jan. 17, 2017   (JP) .................................. 2017-005928

(51) Int. Cl.
| H01L 21/67 | (2006.01) |
| H01L 21/687 | (2006.01) |
| H01L 21/677 | (2006.01) |
| B24B 41/06 | (2012.01) |
| B24B 47/10 | (2006.01) |
| B24B 47/20 | (2006.01) |

(52) U.S. Cl.
CPC ........ H01L 21/67092 (2013.01); B24B 41/06 (2013.01); B24B 47/10 (2013.01); B24B 47/206 (2013.01); H01L 21/6773 (2013.01); H01L 21/68707 (2013.01); H01L 21/68735 (2013.01)

(58) Field of Classification Search
CPC ........... H01L 21/67092; H01L 21/6773; H01L 21/68707; H01L 21/68735; B24B 41/06; B24B 47/206

See application file for complete search history.

(56) References Cited

U.S. PATENT DOCUMENTS

| 6,159,071 | A | * | 12/2000 | Koma | .................... B24B 7/228 |
| | | | | | 451/24 |
| 6,527,627 | B2 | * | 3/2003 | Arai | ....................... B24B 7/228 |
| | | | | | 451/41 |
| 6,582,287 | B2 | * | 6/2003 | Sasayama | ............ B23Q 11/085 |
| | | | | | 451/285 |
| 2002/0081954 | A1 | * | 6/2002 | Mori | ........................ B24B 7/04 |
| | | | | | 451/65 |
| 2007/0264912 | A1 | * | 11/2007 | Kajiyama | ............... B24B 7/228 |
| | | | | | 451/41 |
| 2008/0090505 | A1 | * | 4/2008 | Yoshida | .................... B24B 1/00 |
| | | | | | 451/413 |
| 2008/0268752 | A1 | * | 10/2008 | Nemoto | .................. B24B 7/228 |
| | | | | | 451/8 |
| 2009/0186562 | A1 | * | 7/2009 | Kajiyama | ........... B24B 27/0076 |
| | | | | | 451/57 |

FOREIGN PATENT DOCUMENTS

JP    2014-030883    2/2014

* cited by examiner

*Primary Examiner* — Dung Van Nguyen
(74) *Attorney, Agent, or Firm* — Greer Burns & Crain Ltd.

(57) ABSTRACT

Grinding apparatus includes plural chuck tables disposed on a turntable, a first grinding unit and a second grinding unit that execute infeed grinding of a wafer, and a first grinding feed unit and a second grinding feed unit that execute grinding feed of them. Each grinding feed unit has a pair of guides parallel to the grinding feed direction and a ball screw. The grinding area of each grinding unit has a circular arc shape in which one end exists at the outer circumference of the wafer and the other end exists at the center of the wafer.

2 Claims, 3 Drawing Sheets

GRINDING APPARATUS

BACKGROUND OF THE INVENTION

Field of the Invention

The present invention relates to grinding apparatus that holds wafers by plural holding tables disposed on a turntable and grinds the wafers by plural grinding means.

Description of the Related Art

Conventionally, grinding apparatus that thins a wafer to a finished thickness as the target is known as processing apparatus that processes a wafer (for example, refer to Japanese Patent Laid-open No. 2014-30883). The grinding apparatus disclosed in Japanese Patent Laid-open No. 2014-30883 is provided with rough grinding means that executes rough grinding of a wafer and finish grinding means that executes finish grinding of the wafer. Furthermore, the grinding apparatus is provided with a turntable to which plural chuck tables are fixed, and each chuck table on the turntable is positioned toward a respective one of the grinding means. Then, a rough grinding step and a finish grinding step are concurrently executed for wafers on the respective chuck tables and the wafers are moved between the steps by rotation of the turntable.

In Japanese Patent Laid-open No. 2014-30883, the rough grinding means and the finish grinding means are each formed by providing a mount at the lower end of a rotating shaft and mounting a grinding wheel in which grinding abrasives are disposed in a circular ring manner to the lower surface of the mount rotatably. Furthermore, in the grinding apparatus of Japanese Patent Laid-open No. 2014-30883, the grinding means are each driven in the upward-downward direction to be grinding-fed by a column provided upright and grinding feed means including an advancing-retreating shaft and two guides provided on the column.

Here, in the case of executing infeed grinding, the grinding abrasives are brought into contact with a wafer held by the chuck table in such a manner that the grinding abrasives pass through the center of the wafer, and the wafer is ground. The grinding area in which the grinding abrasives get contact with the wafer have a circular arc shape with the width of the grinding abrasives, and one end of the grinding area is positioned at the outer circumference of the wafer and the other end is positioned at the center of the wafer.

SUMMARY OF THE INVENTION

However, in the grinding apparatus of Japanese Patent Laid-open No. 2014-30883, the grinding means protrude forward from the guides and are supported in a cantilevered manner. Therefore, there is a problem that the columns and the whole apparatus come to be readily tilted due to the grinding load generated by pressing of the upper surface of the wafer by the grinding abrasives and this becomes a cause of grinding failure.

Thus, an object of the present invention is to provide grinding apparatus that can prevent the occurrence of grinding failure due to the grinding load or the like.

In accordance with an aspect of the present invention, there is provided grinding apparatus including a turntable, a plurality of chuck tables that are disposed on the turntable at equal angles in the circumferential direction, with the rotational axial center of the turntable being the center, and are rotatable, and first grinding means to which a first grinding wheel having a plurality of first grinding abrasives disposed in a ring manner is rotatably mounted. The first grinding means executes infeed grinding of a wafer in such a manner that the first grinding abrasives are brought into contact with the wafer in a radius range of the wafer held by the chuck table. The grinding apparatus further includes first grinding feed means that executes grinding feed of the first grinding means in a grinding feed direction in which the first grinding means gets closer to or further away from the chuck table, and second grinding means to which a second grinding wheel having a plurality of second grinding abrasives disposed in a ring manner is rotatably mounted. The second grinding means executes infeed grinding of a wafer in such a manner that the second grinding abrasives are brought into contact with the wafer in a radius range of the wafer held by the chuck table. The grinding apparatus further includes second grinding feed means that executes grinding feed of the second grinding means in the grinding feed direction in which the second grinding means gets closer to or further away from the chuck table. The first grinding feed means includes a pair of first guides that are parallel to the grinding feed direction and are disposed to sandwich the first grinding means and a first advancing-retreating shaft that causes the first grinding means whose direction is defined by the first guides to advance and retreat in the grinding feed direction. The second grinding feed means includes a pair of second guides that are parallel to the grinding feed direction and are disposed to sandwich the second grinding means and a second advancing-retreating shaft that causes the second grinding means whose direction is defined by the second guides to advance and retreat in the grinding feed direction. A first grinding area in which the first grinding means grinds the wafer held by the chuck table has a circular arc shape that has the width of the first grinding abrasives and is centered at the center of the first grinding wheel, and one end of the first grinding area is positioned at the outer circumference of the wafer and the other end is positioned at the center of the wafer. A second grinding area in which the second grinding means grinds the wafer held by the chuck table has a circular arc shape that has the width of the second grinding abrasives and is centered at the center of the second grinding wheel, and one end of the second grinding area is positioned at the outer circumference of the wafer and the other end is positioned at the center of the wafer. The centroid of the first grinding area is disposed on a first reference line that couples the axial centers of the pair of first guides, and a chord that couples the one end and the other end of the first grinding area and the first reference line are disposed to be orthogonal to each other. The centroid of the second grinding area is disposed on a second reference line that couples the axial centers of the pair of second guides, and a chord that couples the one end and the other end of the second grinding area and the second reference line are disposed to be orthogonal to each other. The first reference line of the first grinding feed means and the second reference line of the second grinding feed means are disposed at symmetrical positions with respect to the rotational axial center of the turntable.

According to this configuration, the chord in the first or second grinding area having the circular arc shape and the first or second reference line that couples the axial centers of the pair of first or second guides are disposed to be orthogonal to each other. Thus, even when a grinding load is applied to the first or second grinding means, a force acts on the pair of first or second guides less readily due to the grinding load. This can prevent the rotation center position of each grinding wheel from tilting due to the grinding load and avoid the occurrence of grinding failure.

Preferably, the axial center of the first advancing-retreating shaft of the first grinding means and the axial center of the second advancing-retreating shaft of the second grinding means are each disposed on the first or second reference line.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
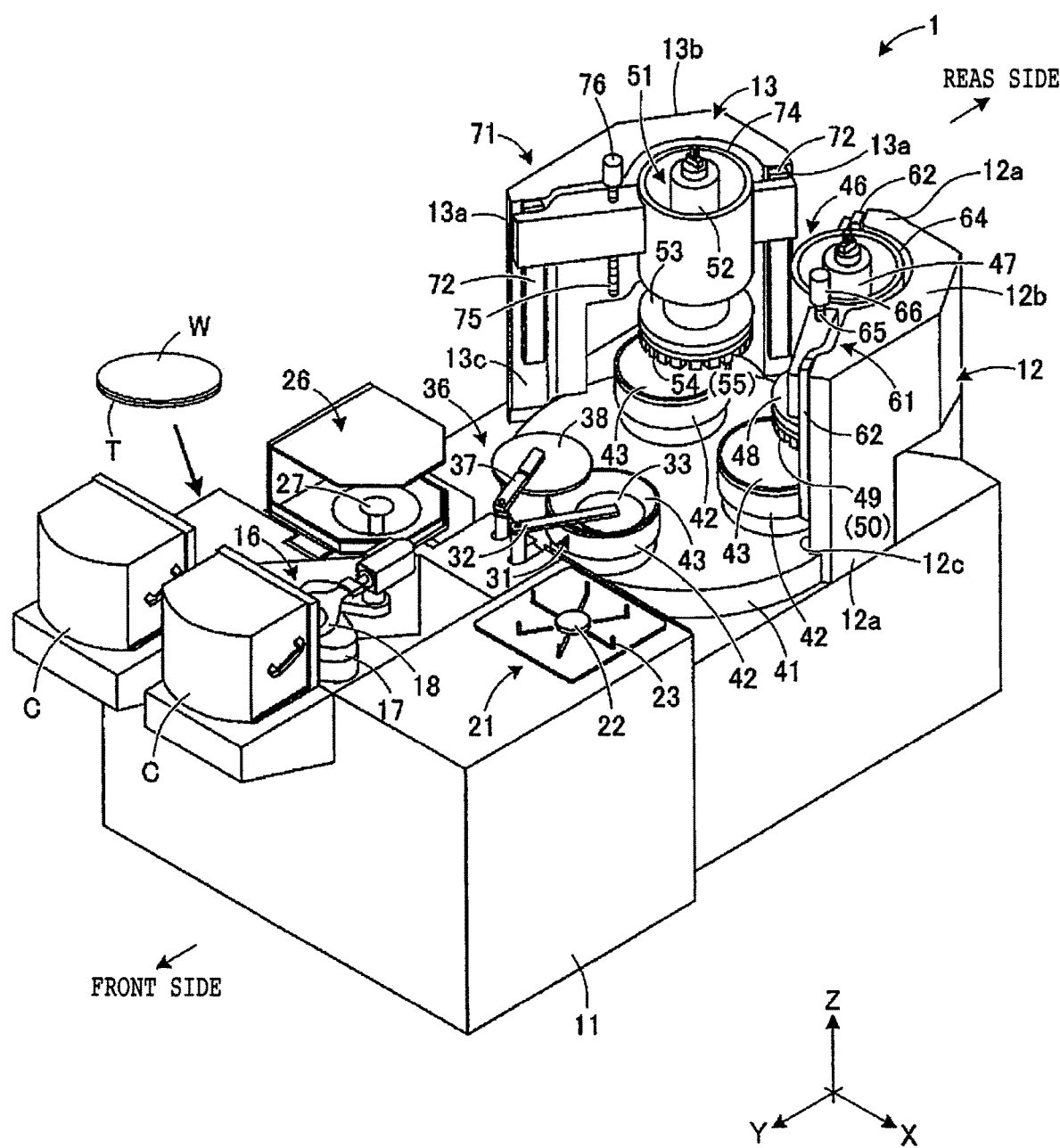
FIG. 1 is a perspective view of grinding apparatus according to an embodiment of the present invention.

Grinding apparatus according to an embodiment of the present invention will be described below with reference to the accompanying drawings. FIG. 1 is a perspective view of the grinding apparatus according to the present embodiment. In the present embodiment, the grinding apparatus is not limited to the configuration depicted in FIG. 1. The grinding apparatus may be configured in any manner as long as grinding means can be disposed as described later.

As depicted in FIG. 1, grinding apparatus 1 is configured to fully automatically execute a series of tasks composed of carry-in processing, rough grinding processing, finish grinding processing, cleaning processing, and carry-out processing for a wafer W. The wafer W is formed into a substantially circular disc shape and is carried in to the grinding apparatus 1 in the state of being housed in a cassette C. It suffices for the wafer W to be a plate-shaped work that becomes a grinding target. The wafer W may be a semiconductor substrate of silicon, gallium arsenide, or the like and may be an inorganic material substrate of ceramic, glass, sapphire, or the like. Moreover, the wafer W may be a package substrate of a semiconductor product or the like. The back surface (upper surface in FIG. 1) of the wafer W is treated as a grinding-target surface to be subjected to grinding processing and a protective tape T is stuck to the front surface (lower surface in FIG. 1).

A pair of cassettes C in which plural wafers W are housed are placed on the front side of a base 11 of the grinding apparatus 1. A cassette robot 16 that draws and loads the wafer W from and into the cassette C is provided on the rear side of the pair of cassettes C. A positioning mechanism 21 that executes positioning of the before-processing wafer W and a spinner cleaning mechanism 26 that cleans the wafer W that has been processed are provided on the left and right rear sides of the cassette robot 16. Carry-in means 31 that carries in the before-processing wafer W in to a chuck table (holding table) 42 and carry-out means 36 that carries out the wafer W that has been processed from the chuck table 42 are provided between the positioning mechanism 21 and the spinner cleaning mechanism 26.

The cassette robot 16 is formed by providing a hand part 18 at the tip of a robot arm 17 formed of a multi-joint link. By the cassette robot 16, the before-processing wafer W is conveyed from the cassette C to the positioning mechanism 21. Besides, the wafer W that has been processed is conveyed from the spinner cleaning mechanism 26 to the cassette C. The positioning mechanism 21 is formed by disposing, around a provisional placement table 22, plural positioning pins 23 that can advance and retreat relative to the center of the provisional placement table 22. In the positioning mechanism 21, the plural positioning pins 23 are made to abut against the outer circumferential edge of the wafer W placed on the provisional placement table 22 and thereby the center of the wafer W is positioned at the center of the provisional placement table 22.

The carry-in means 31 is formed by providing a carry-in pad 33 at the tip of a carry-in arm 32 that can pivot over the base 11. With the carry-in means 31, the wafer W is raised from the provisional placement table 22 by the carry-in pad 33 and is carried in to the chuck table 42 through a pivot of the carry-in pad 33 by the carry-in arm 32. The carry-out means 36 is formed by providing a conveying pad 38 at the tip of a carry-out arm 37 that can pivot over the base 11. With the carry-out means 36, the wafer W is held by suction to be raised from the chuck table 42 by the conveying pad 38 and is carried out from the chuck table 42 through a pivot of the conveying pad 38 by the carry-out arm 37.

The spinner cleaning mechanism 26 is formed by providing various kinds of nozzles (not depicted) that inject cleaning water and drying air toward a spinner table 27. In the spinner cleaning mechanism 26, the spinner table 27 that holds the wafer W is lowered to the inside of the base 11 and the wafer W is subjected to spinner cleaning through injection of the cleaning water in the base 11. Then, the drying air is sprayed and the wafer W is dried. A turntable 41 that can rotate is provided on the rear side of the carry-in means 31 and the carry-out means 36. Plural (three, in the present embodiment) chuck tables 42 are rotatably provided on the turntable 41. The three chuck tables 42 are disposed at equal angles (120°, in the present embodiment) with the rotational axial center of the turntable 41 being the center. At the upper surface of each chuck table 42, a holding surface 43 that holds the wafer W by suction with the intermediary of the protective tape T is formed. The holding surface 43 has an inclined surface that is inclined in such a manner that the rotation center of the chuck table 42 (center of the holding surface 43) is the apex and the outer circumference is slightly lower, and the wafer W becomes a circular conical shape with a gentle inclination in accordance with the form of the holding surface 43.

The turntable 41 intermittently rotates at intervals of 120 degrees. Thereby, the wafers W held by the chuck tables 42 are sequentially positioned to carry-in/out positions at which the wafer W is carried in and out, a rough grinding position at which the wafer W faces rough grinding means (first grinding means) 46, and a finish grinding position at which the wafer W faces finish grinding means (second grinding means) 51. At the rough grinding position, the wafer W is subjected to rough grinding to a predetermined thickness by the rough grinding means 46. At the finish grinding position, the wafer W is subjected to finish grinding to a finished thickness by the finish grinding means 51. A first column 12 and a second column 13 are provided upright around the turntable 41.

The first column 12 is provided with first grinding feed means 61. The first grinding feed means 61 executes grinding feed by moving the rough grinding means 46 in a grinding feed direction in which the rough grinding means 46 gets closer to or further away from the chuck table 42, i.e. in the Z-axis direction. The first grinding feed means 61 has two guides 62 formed of rails that are provided on the first column 12 and are parallel to the Z-axis direction. The two guides 62 are disposed to sandwich the rough grinding means 46 and support the rough grinding means 46 with the intermediary of a spindle holder 64. In addition, the two guides 62 define the direction of the movement of the rough grinding means 46 in the Z-axis direction. A ball screw 65 as an advancing-retreating shaft is screwed to the spindle holder 64 and a drive motor 66 is joined to one end of the ball screw 65. The ball screw 65 is rotationally driven by the drive motor 66 and the rough grinding means 46 is caused to advance and retreat in the Z-axis direction along the guides 62.

Similarly, the second column 13 is provided with second grinding feed means 71. The second grinding feed means 71 executes grinding feed by moving the finish grinding means 51 in a grinding feed direction in which the finish grinding means 51 gets closer to or further away from the chuck table 42, i.e. in the Z-axis direction. The second grinding feed means 71 has two guides 72 formed of rails that are provided on the second column 13 and are parallel to the Z-axis direction. The two guides 72 are disposed to sandwich the finish grinding means 51 and support the finish grinding means 51 with the intermediary of a spindle holder 74. In addition, the two guides 72 define the direction of the movement of the finish grinding means 51 in the Z-axis-direction. A ball screw 75 as an advancing-retreating shaft is screwed to the spindle holder 74 and a drive motor 76 is joined to one end of the ball screw 75. The ball screw 75 is rotationally driven by the drive motor 76 and the finish grinding means 51 is caused to advance and retreat in the Z-axis direction along the guides 72.

A mount 48 is provided at the lower end of a spindle 47 of the rough grinding means 46 and a first grinding wheel 49 for rough grinding in which plural rough grinding abrasives (first grinding abrasives) 50 are disposed in a ring manner is mounted to the lower surface of the mount 48. The spindle 47 has a rotating shaft (not depicted) that can rotate and the first grinding wheel 49 is rotatably mounted with the intermediary of the mount 48. The rough grinding abrasives 50 are formed of diamond abrasives obtained by consolidating diamond abrasive grains by a binding agent such as a metal bond or a resin bond, for example. Furthermore, a mount 53 is provided at the lower end of a spindle 52 of the finish grinding means 51 and a second grinding wheel 54 for finish grinding in which plural finish grinding abrasives (second grinding abrasives) 55 are disposed in a ring manner is mounted to the lower surface of the mount 53. The spindle 52 has a rotating shaft (not depicted) that can rotate and the second grinding wheel 54 is rotatably mounted with the intermediary of the mount 53. The finish grinding abrasives 55 are formed of abrasive grains having smaller grain size than the rough grinding abrasives 50.

In the case of grinding the wafer W by such grinding apparatus 1, first the wafer W is conveyed from the inside of the cassette C to the positioning mechanism 21 and centering of the wafer W is executed in the positioning mechanism 21. Next, the wafer W is carried in onto the chuck table 42 and is held by suction in such a manner that the grinding-target surface that is the back surface of the wafer W is oriented upward and the protective tape T stuck to the front surface is oriented downward. Then, the wafer W is positioned to the rough grinding position and the finish grinding position in that order by the rotation of the turntable 41.

In rough grinding processing of the wafer W at the rough grinding position, the wafer W is held by suction by the chuck table 42, with the surface of the protective tape T stuck to the wafer W being the held surface. In this state, the rough grinding abrasives 50 that rotate are brought into contact with the upper surface of the wafer W in a radius range while the chuck table 42 is rotated around the Z-axis, and the wafer W is subjected to rough grinding by infeed grinding in which the upper surface of the wafer W is treated as the grinding-target surface. Then, in finish grinding processing of the wafer W at the finish grinding position resulting from the rotation of the turntable 41, the finish grinding abrasives 55 that rotate are brought into contact with the grinding-target surface (upper surface) of the wafer W in a radius range while the chuck table 42 is rotated around the Z-axis, and the wafer W is subjected to finish grinding by infeed grinding. In the infeed grinding, the upper surface of the wafer W is pressed in the contact areas of the respective grinding abrasives 50 and 55 and the grinding load at the time acts on the chuck table 42, the rough grinding means 46, and the finish grinding means 51.

After the finish grinding, the ground surface of the wafer W is held by suction by the conveying pad 38 of the carry-out means 36 and the wafer W is carried out to the spinner cleaning mechanism 26. The wafer W is cleaned by the spinner cleaning mechanism 26 and is carried out from the spinner cleaning mechanism 26 to the cassette C.

Figure 2:
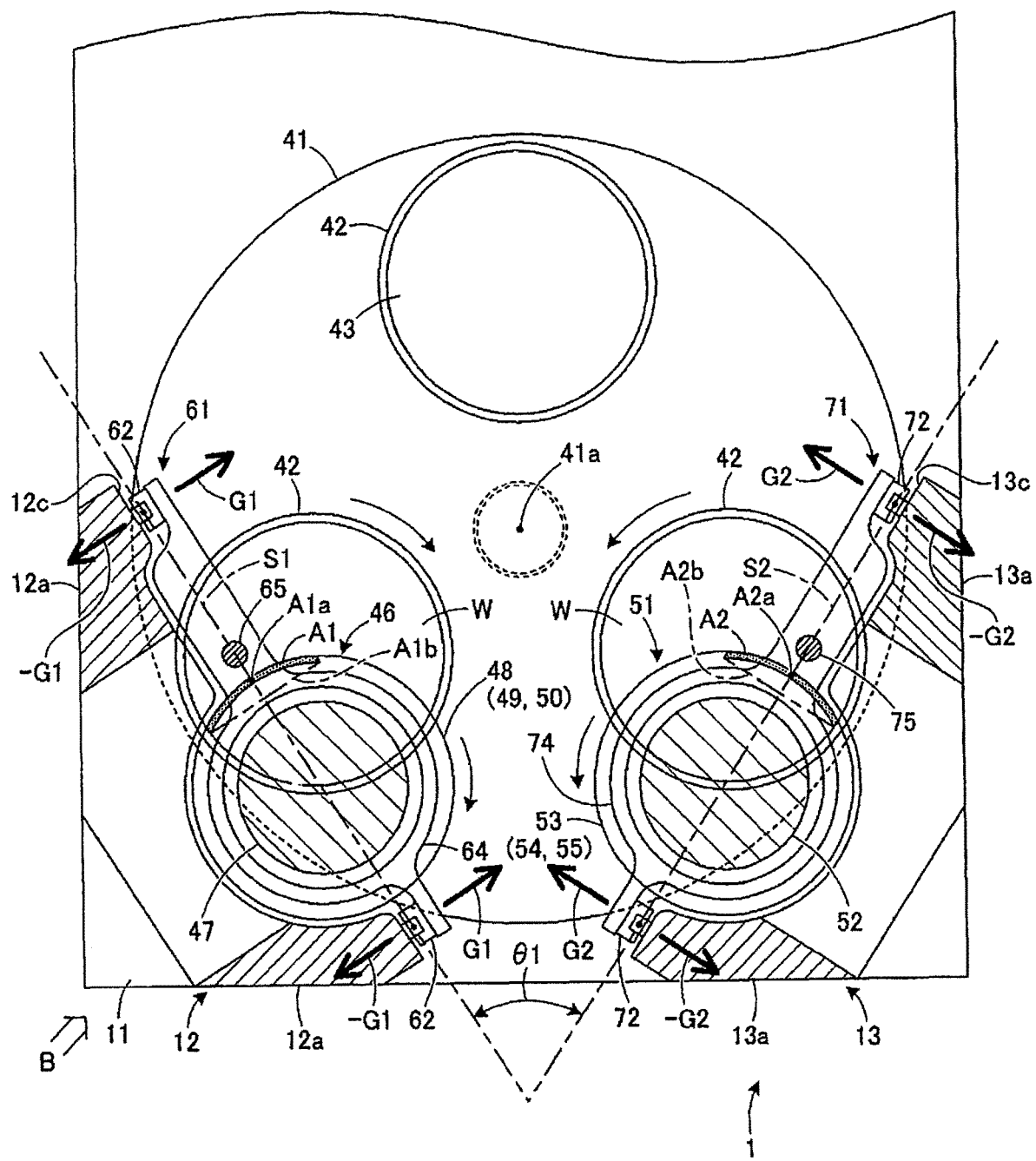
FIG. 2 is a schematic diagram when the major configuration of the grinding apparatus is viewed from above as a partial cross-section.

Subsequently, with reference to FIG. 2 and FIG. 3 in addition to FIG. 1, the positional relation in the above-described configuration of the grinding apparatus 1 will be described. FIG. 2 is a schematic diagram when the major configuration of the grinding apparatus is viewed from above as a partial cross-section.

As depicted in FIG. 1 and FIG. 2, the first column 12 and the second column 13 are each formed of a gate-shaped column provided to face the turntable 41. The respective columns 12 and 13 include a pair of pillar parts 12a and 13a located along the guides 62 and 72 and joining parts 12b and 13b (see FIG. 1, not depicted in FIG. 2) that join the upper parts of the pair of pillar parts 12a and 13a. The joining parts 12b and 13b are disposed on the upper side relative to the mounts 48 and 53 and the respective grinding wheels 49 and 54.

Figure 3:
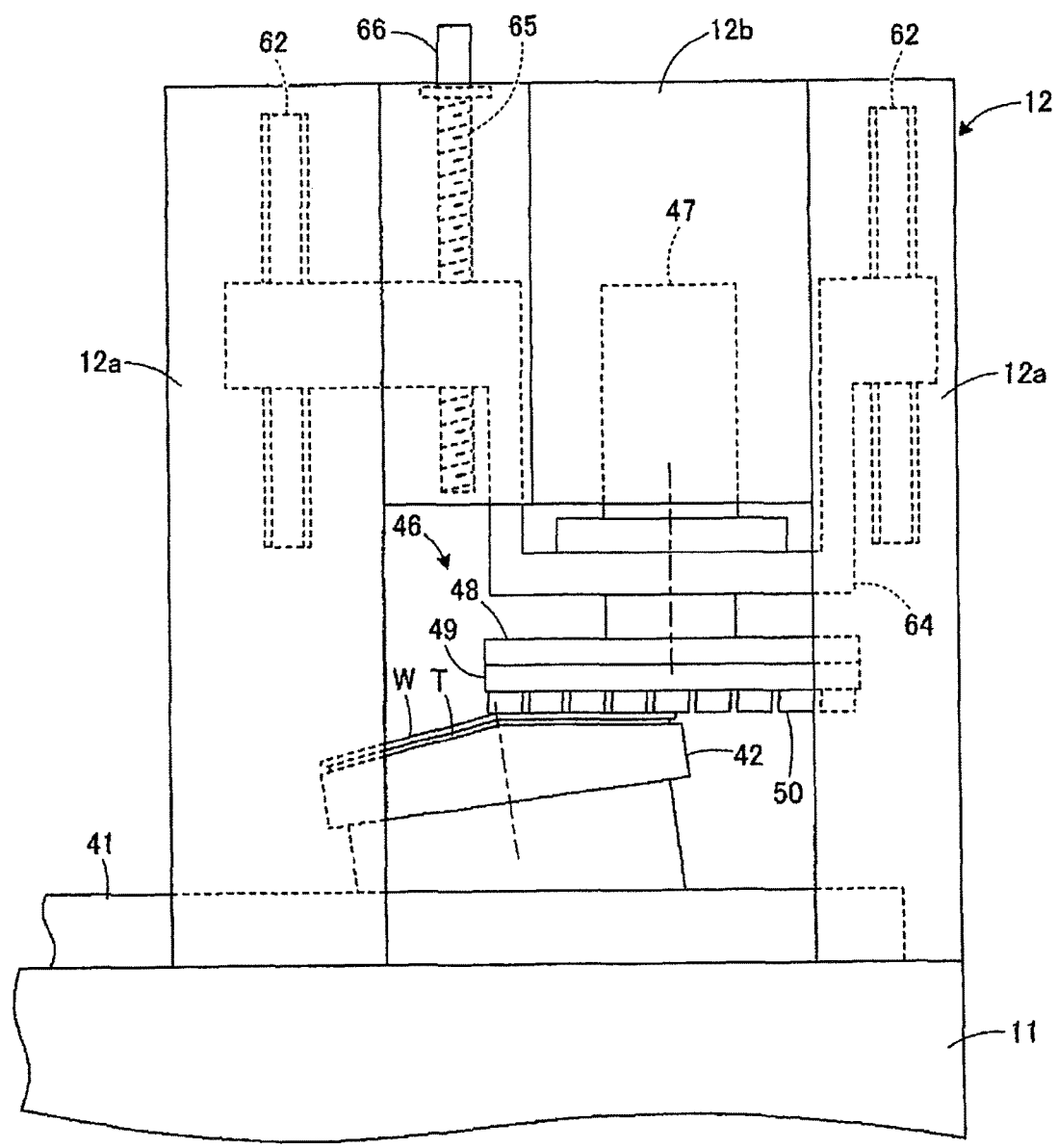
FIG. 3 is a schematic diagram of a column as viewed in the direction of arrow B in FIG. 2.

FIG. 3 is an explanatory diagram of the column as viewed in the direction of arrow B in FIG. 2. As depicted in FIG. 3, in the first column 12, an opening is formed between the two pillar parts 12a on the lower side of the joining part 12b. Although not depicted in FIG. 3, the second column 13 is also formed into a shape that is bilaterally symmetrical with the first column 12 and thus an opening is formed between the two pillar parts 13a on the lower side of the joining part 13b similarly to the first column 12. Therefore, with the first column 12 and the second column 13, a worker is allowed to perform replacement and maintenance of the respective grinding wheels 49 and 54 from the back side of these columns through the opening.

Referring back to FIG. 2, the surfaces on the side opposed to the turntable 41 in the respective columns 12 and 13 are employed as support surfaces 12c and 13c that support the guides 62 and 72. Here, a virtual line that couples the respective axial centers of the two guides 62 supported by the support surfaces 12c is defined as a reference line S1 of the first grinding feed means 61. Furthermore, a virtual line that couples the respective axial centers of the two guides 72 supported by the support surfaces 13c is defined as a reference line S2 of the second grinding feed means 71.

In top view, the respective columns 12 and 13 and the guides 62 and 72 are set in such a manner that the reference line S1 of the first grinding feed means 61 and the reference line S2 of the second grinding feed means 71 are disposed at symmetrical positions with a rotational axial center 41a of the turntable 41 being the axis. In other words, a positional relation is made in which the rotational axial center 41a of the turntable 41 is disposed on the bisector of an interior angle θ1 formed at the intersection position of the respective reference lines S1 and S2. Here, the interior angle θ1 is formed as an acute angle and is preferably set in a range of 50° to 70°. The optimum value of the interior angle θ1 is 60°. By making the positional relation in which the reference lines S1 and S2 are disposed in this manner, grinding areas A1 and A2 of the rough grinding means 46 and the finish grinding means 51 are disposed at symmetrical positions with the rotational axial center 41a of the turntable 41 being the axis, and the grinding apparatus 1 can be made compact.

In the respective columns 12 and 13, the surfaces located on the opposite side to the turntable 41 are formed into a shape along the outer circumferential edge of the base 11 in top view, so that compactization as the whole of the grinding apparatus 1 is intended. Furthermore, the pillar parts 12a and 13a on the front side (upper side in the plane of paper of FIG. 2) are formed to cover the turntable 41 from the upper side (see FIG. 1) and the guides 62 and 72 are also located above the turntable 41. Due to the provision of the respective columns 12 and 13 above the turntable 41 in such a manner that the columns 12 and 13 cover the turntable 41 as above, the placement space of the respective columns 12 and 13 can be made small and compactization of the whole can be intended also based on this.

At the time of grinding of the wafers W, the chuck table 42 that holds the wafer W that has not been ground is positioned below the rough grinding means 46 and the chuck table 42 that holds the wafer W that has been subjected to the rough grinding is positioned below the finish grinding means 51. Thereafter, when the rough grinding and the finish grinding are started as described above, the wafers W and the grinding abrasives 50 and 55 are brought into contact with each other and these contact areas are defined as the grinding areas A1 and A2. Specifically, because the holding surface 43 of the chuck table 42 is a circular conical surface (see FIG. 3), the grinding areas A1 and A2 each become a circular arc shape that has the width of the grinding abrasives 50 or 55 and is centered at the center of the grinding wheel 49 or 54. Furthermore, one end of this circular arc is positioned at the outer circumference of the wafer W and the other end is positioned at the center of the wafer W. Here, in FIG. 2, the centroids of the grinding areas A1 and A2 based on top view are represented by symbols A1a and A2a and chords that couple one end and the other end in the grinding areas A1 and A2 are represented by symbols A1b and A2b.

In the present embodiment, the first column 12, the first grinding feed means 61, the rough grinding means 46, and so forth are configured to make a positional relation in which the centroid A1a of the grinding area A1 is located on the reference line S1 of the first grinding feed means 61. Furthermore, the configuration is made also in such a manner that a positional relation in which the chord A1b of the grinding area A1 and the reference line S1 of the first grinding feed means 61 are orthogonal to each other holds. Moreover, the configuration is made also in such a manner that the axial center of the ball screw 65 in the first grinding feed means 61 is disposed on the reference line S1 and the midpoint of the two guides 62 corresponds with the centroid A1a of the grinding area A1 or is located near the centroid A1a. That is, the shape, size, and direction of the first column 12, the spindle holder 64, and so forth are set in such a manner that the rough grinding means 46 can grind the wafer W on the chuck table 42 while these positional relations are satisfied. At this time, in top view, the reference line S1 passes above the chuck table 42 and passes through the center of the first grinding wheel 49 or the vicinity thereof.

The second column 13, the second grinding feed means 71, and the finish grinding means 51 are provided with a structure that is bilaterally symmetrical with the first column 12, the first grinding feed means 61, and the rough grinding means 46 except for the grinding abrasives. Specifically, the second column 13, the second grinding feed means 71, the finish grinding means 51, and so forth are configured to make a positional relation in which the centroid A2a of the grinding area A2 is located on the reference line S2 of the second grinding feed means 71. Furthermore, the configuration is made also in such a manner that a positional relation in which the chord A2b of the grinding area A2 and the reference line S2 of the second grinding feed means 71 are orthogonal to each other holds. Moreover, the configuration is made also in such a manner that the axial center of the ball screw 75 in the second grinding feed means 71 is disposed on the reference line S2 and the midpoint of the two guides 72 corresponds with the centroid A2a of the grinding area A2 or is located near the centroid A2a. That is, the shape, size, and direction of the second column 13, the spindle holder 74, and so forth are set in such a manner that the finish grinding means 51 can grind the wafer W on the chuck table 42 while these positional relations are satisfied. At this time, in top view, the reference line S2 passes above the chuck table 42 and passes through the center of the second grinding wheel 54 or the vicinity thereof.

As described above, in the above-described embodiment, while the centroids A1a and A2a of the grinding areas A1 and A2 are disposed on the reference lines S1 and S2, the chords A1b and A2b and the reference lines S1 and S2 are orthogonal to each other. Therefore, it is possible to suppress the tilt of the grinding means 46 and 51 when the grinding load with which the wafers W are ground by the respective grinding means 46 and 51 is applied. To describe this in detail, the Z-axis direction of the grinding means 46 and 51 (grinding feed direction) is defined (guided) in the state in which the grinding means 46 and 51 are sandwiched by the two guides 62 and 72, and the grinding load is evenly applied on both sides of the grinding areas A1 and A2 across the reference lines S1 and S2. This can suppress application of forces G1, −G1, G2, and −G2 in the directions orthogonal to the Z-axis direction and the reference lines S1 and S2 to the guides 62 and 72. Moreover, in top view (FIG. 2), the midpoints of the two guides 62 and 72 are made to correspond with the centroids A1a and A2a of the grinding areas A1 and A2, respectively. As a result, application of forces in directions other than the grinding feed direction to the two guides 62 and 72 is eliminated and the rotational axis of the grinding means 46 and 51 and the grinding wheels 49 and 54 included in them tilts less readily. This can improve the thickness accuracy of the ground wafer W and avoid the occurrence of grinding failure.

Furthermore, the axial centers of the ball screws 65 and 75 are disposed on the reference lines S1 and S2 and thus the force (grinding load) that acts due to the ball screws 65 and 75 can be efficiently exerted. Moreover, it is preferable to dispose the axial centers of the ball screws 65 and 75 at positions close to the grinding areas A1 and A2. This can also contribute to suppression of the tilt of the rotational axis of the grinding wheels 49 and 54, which can enhance the surface accuracy of the wafer W and prevent the occurrence of grinding failure.

Gate-shaped columns are employed as the first column 12 and the second column 13 and the openings are formed.

Thus, the respective grinding wheels 49 and 54 can be visually recognized and treated from the back side of the respective columns 12 and 13. Here, in the above-described embodiment, the support surfaces 12c and 13c of the respective columns 12 and 13 are oriented toward the rotational axial center 41a of the turntable 41 from the corner side of the base 11. For this reason, if replacement or adjustment of the respective grinding wheels 49 and 54 is attempted from the front side, the turntable 41 with a large size is located between the worker and the respective grinding wheels 49 and 54, so that the distance to them becomes long and it becomes difficult for the hands of the worker to reach them. Regarding this point, in the above-described embodiment, the respective grinding wheels 49 and 54 can be treated through the openings of the respective columns 12 and 13 and the workability of replacement and maintenance can be favorably kept.

The shape, size, and direction of the respective columns 12 and 13, the spindle holders 64 and 74, and so forth in the above-described embodiment are not particularly limited and various design changes are possible as long as the mutual positional relation of the reference lines S1 and S2 and the positional relation between the reference lines S1 and S2 and the centroids A1a and A2a and the chords A1b and A2b of the grinding areas A1 and A2 are the same as the above description.

Furthermore, embodiments of the present invention are not limited to the above-described embodiment and modification examples and may be variously changed, replaced, and modified without departing from the gist of technical ideas of the present invention. Moreover, if technical ideas of the present invention can be implemented in another way by advancement in technique or another technique that is derivative, the present invention may be carried out by using the method. Therefore, the scope of claims covers all embodiments that can be included in the range of technical ideas of the present invention.

Moreover, although the configuration in which the present invention is applied to grinding apparatus is described in the present embodiment, it is also possible to apply the present invention to another piece of processing apparatus such as polishing apparatus for which the tilt of the rotational axis of a wheel that rotates is prevented and the processing accuracy is improved.

As described above, the present invention has an effect that the occurrence of grinding failure can be prevented and is useful for grinding apparatus that grinds wafers by two grinding means with use of a turntable.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. Grinding apparatus comprising:
   a turntable;
   a plurality of chuck tables that are disposed on the turntable at equal angles in a circumferential direction, with a rotational axial center of the turntable being a center, and are rotatable;
   first grinding means to which a first grinding wheel having a plurality of first grinding abrasives disposed in a ring manner is rotatably mounted, the first grinding means executing infeed grinding of a wafer in such a manner that the first grinding abrasives are brought into contact with the wafer in a radius range of the wafer held by the chuck table;
   first grinding feed means that executes grinding feed of the first grinding means in a grinding feed direction in which the first grinding means gets closer to or further away from the chuck table;
   second grinding means to which a second grinding wheel having a plurality of second grinding abrasives disposed in a ring manner is rotatably mounted, the second grinding means executing infeed grinding of a wafer in such a manner that the second grinding abrasives are brought into contact with the wafer in a radius range of the wafer held by the chuck table; and
   second grinding feed means that executes grinding feed of the second grinding means in the grinding feed direction in which the second grinding means gets closer to or further away from the chuck table,
   wherein the first grinding feed means includes a pair of first guides that are parallel to the grinding feed direction and are disposed to sandwich the first grinding means and a first advancing-retreating shaft that causes the first grinding means whose direction is defined by the first guides to advance and retreat in the grinding feed direction,
   the second grinding feed means includes a pair of second guides that are parallel to the grinding feed direction and are disposed to sandwich the second grinding means and a second advancing-retreating shaft that causes the second grinding means whose direction is defined by the second guides to advance and retreat in the grinding feed direction,
   a first grinding area in which the first grinding means grinds the wafer held by the chuck table has a circular arc shape that has a width of the first grinding abrasives and is centered at a center of the first grinding wheel, and one end of the first grinding area is positioned at outer circumference of the wafer and the other end is positioned at a center of the wafer,
   a second grinding area in which the second grinding means grinds the wafer held by the chuck table has a circular arc shape that has a width of the second grinding abrasives and is centered at a center of the second grinding wheel, and one end of the second grinding area is positioned at outer circumference of the wafer and the other end is positioned at a center of the wafer,
   a centroid of the first grinding area is disposed on a first reference line that couples axial centers of the pair of first guides, and a chord that couples the one end and the other end of the first grinding area and the first reference line are disposed to be orthogonal to each other,
   a centroid of the second grinding area is disposed on a second reference line that couples axial centers of the pair of second guides, and a chord that couples the one end and the other end of the second grinding area and the second reference line are disposed to be orthogonal to each other, and
   the first reference line of the first grinding feed means and the second reference line of the second grinding feed means are disposed at symmetrical positions with respect to the rotational axial center of the turntable.

2. The grinding apparatus according to claim 1, wherein an axial center of the first advancing-retreating shaft of the first grinding means is disposed on the first reference line and an axial center of the second advancing-retreating shaft of the second grinding means is disposed on the second reference line.

\* \* \* \* \*